United States Patent
Beyer et al.

(10) Patent No.: US 8,728,924 B2
(45) Date of Patent: May 20, 2014

(54) GATE ELECTRODES OF A SEMICONDUCTOR DEVICE FORMED BY A HARD MASK AND DOUBLE EXPOSURE IN COMBINATION WITH A SHRINK SPACER

(75) Inventors: Sven Beyer, Dresden (DE); Andreas Hellmich, Dresden (DE); Steffen Laufer, Dresden (DE); Klaus Gebauer, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/187,795

(22) Filed: Jul. 21, 2011

(65) Prior Publication Data
US 2012/0049286 A1    Mar. 1, 2012

(30) Foreign Application Priority Data

Aug. 31, 2010    (DE) .................... 10 2010 040 066

(51) Int. Cl.
*H01L 21/28*    (2006.01)
*H01L 21/3213*    (2006.01)

(52) U.S. Cl.
CPC .... *H01L 21/32139* (2013.01); *H01L 21/28123* (2013.01)
USPC ............ 438/585; 438/400; 257/368

(58) Field of Classification Search
CPC .................... H01L 21/28123; H01L 21/32139
See application file for complete search history.

(56) References Cited

U.S. PATENT DOCUMENTS

| | | |
|---|---|---|
| 6,069,382 A | 5/2000 | Rahim |
| 2005/0176193 A1 | 8/2005 | Kang et al. |
| 2007/0238053 A1 | 10/2007 | Hashimoto |
| 2008/0032508 A1 | 2/2008 | Chang |
| 2008/0286698 A1 | 11/2008 | Zhuang et al. |
| 2010/0124815 A1 | 5/2010 | Sudo |
| 2010/0176479 A1 | 7/2010 | Postnikov et al. |
| 2010/0203717 A1 | 8/2010 | Kanakasabathy et al. |

OTHER PUBLICATIONS

Translation of Official Communication from German Patent Application No. 10 2010 040 066.1 dated Oct. 10, 2011.
Translation of Official Communication from German Patent Application No. 10 2010 040 066.1 dated Mar. 18, 2011.

*Primary Examiner* — Fernando L Toledo
*Assistant Examiner* — Valerie N Newton
(74) *Attorney, Agent, or Firm* — Amerson Law Firm, PLLC

(57) ABSTRACT

When forming complex gate electrode structures, a double exposure double etch strategy may be applied, in which the lateral distance in the width direction of the gate electrode structures may be defined prior to forming mask features for defining the gate length. In this case, the width dimension of the mask opening may be adjusted on the basis of a spacer element, which may thus allow providing a reduced dimension on the basis of well-established process techniques.

9 Claims, 10 Drawing Sheets

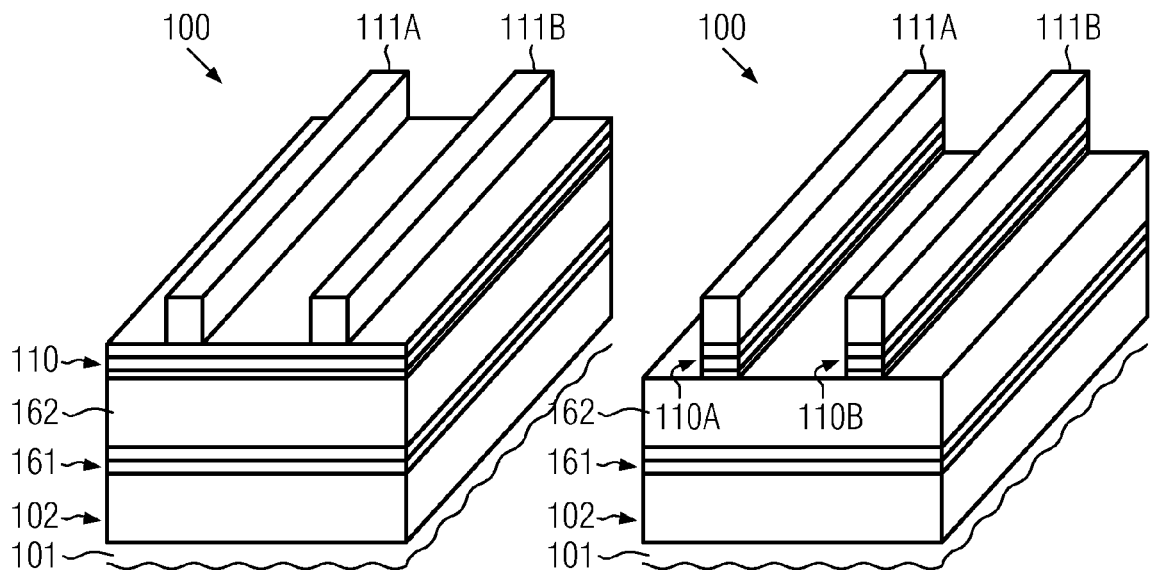
FIG. 1c
(prior art)
FIG. 1d
(prior art)
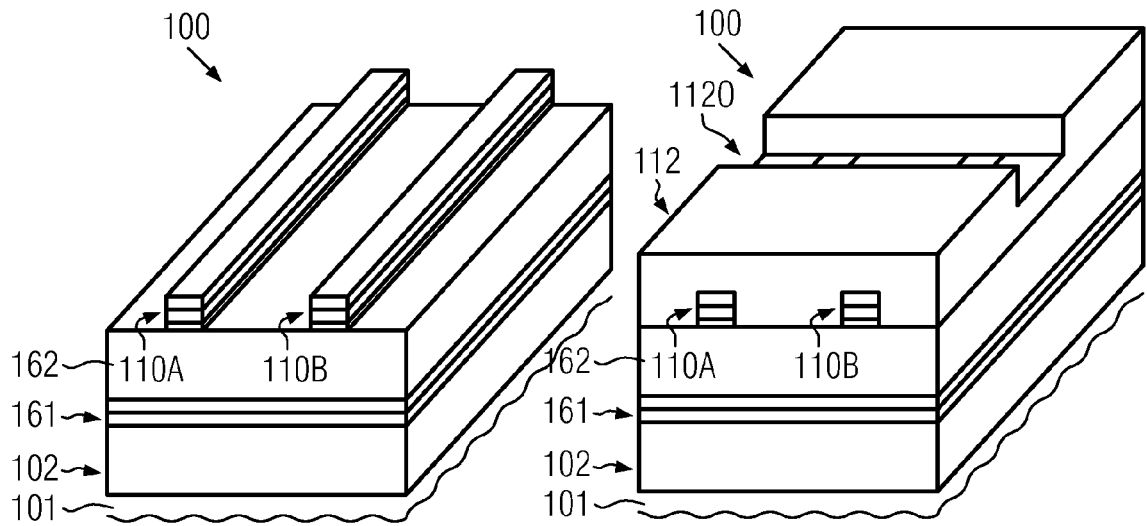
FIG. 1e
(prior art)
FIG. 1f
(prior art)

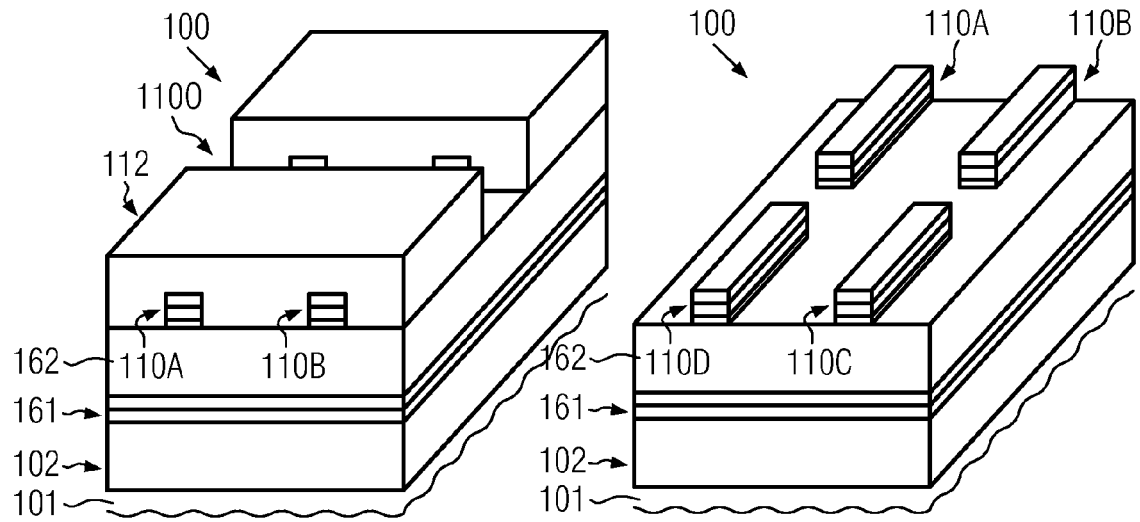
FIG. 1g
(prior art)
FIG. 1h
(prior art)
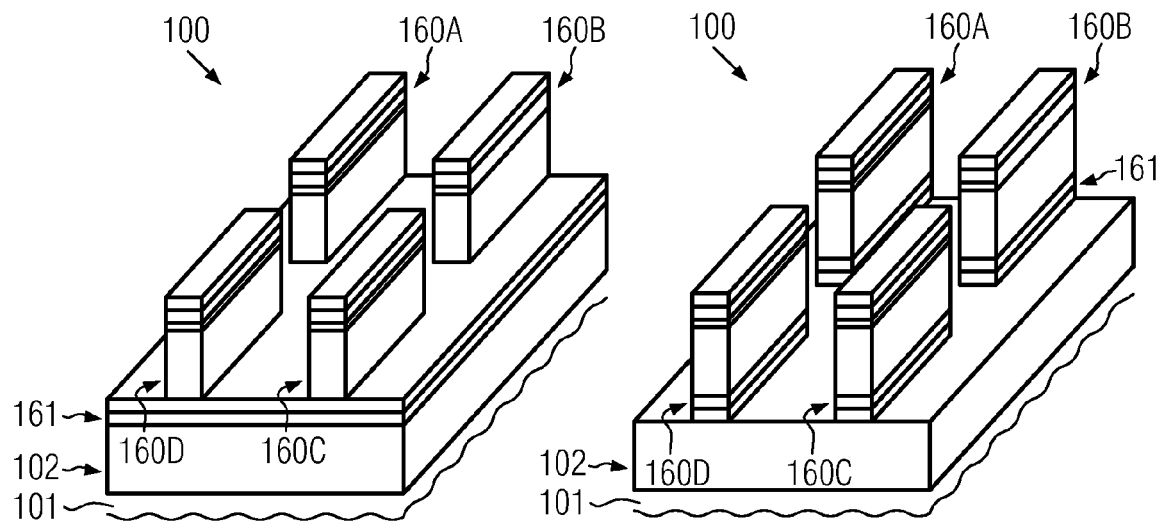
FIG. 1i
(prior art)
FIG. 1j
(prior art)

GATE ELECTRODES OF A SEMICONDUCTOR DEVICE FORMED BY A HARD MASK AND DOUBLE EXPOSURE IN COMBINATION WITH A SHRINK SPACER

BACKGROUND OF THE INVENTION

1. Field of the Invention

Generally, the subject matter disclosed herein relates to integrated circuits, and, more particularly, to gate electrode structures formed by double exposure and double etch techniques.

2. Description of the Related Art

The fabrication of microstructures, such as integrated circuits, requires tiny regions of precisely controlled size to be formed in one or more material layers of an appropriate substrate, such as a silicon substrate, a silicon-on-insulator (SOI) substrate, or other suitable carrier materials. These tiny regions of precisely controlled size are typically defined by patterning the material layer(s) by applying lithography, etch, implantation, deposition processes and the like, wherein typically, at least in a certain stage of the patterning process, a mask layer may be formed over the material layer(s) to be treated to define these tiny regions. Generally, a mask layer may consist of or may be formed by means of a layer of resist that is patterned by a lithographic process, typically a photolithography process. During the photolithography process, the resist may be spin-coated onto the substrate surface and then selectively exposed to ultraviolet radiation through a corresponding lithography mask, such as a reticle, thereby imaging the reticle pattern into the resist layer to form a latent image therein. After developing the photoresist, depending on the type of resist, positive resist or negative resist, the exposed portions or the non-exposed portions are removed to form the required pattern in the layer of photoresist. Based on this resist pattern, actual device patterns may be formed by further manufacturing processes, such as etching, implantation and the like. Since the dimensions of the patterns in sophisticated integrated microstructure devices are steadily decreasing, the equipment used for patterning device features have to meet very stringent requirements with regard to resolution and overlay accuracy of the involved fabrication processes. In this respect, resolution is considered as a measure for specifying the consistent ability to print minimum size images under conditions of predefined manufacturing variations. One important factor in improving the resolution is the lithographic process, in which patterns contained in the photo mask or reticle are optically transferred to the substrate via an optical imaging system. Therefore, great efforts are made to steadily improve optical properties of the lithographic system, such as numerical aperture, depth of focus and wavelength of the light source used.

The resolution of the optical patterning process may, therefore, significantly depend on the imaging capability of the equipment used, the photoresist materials for the specified exposure wavelength and the target critical dimensions of the device features to be formed in the device level under consideration. For example, gate electrodes of field effect transistors, which represent an important component of modern logic devices, may have a length of less than 50 nm in currently produced devices, with significantly reduced dimensions for device generation that are currently under development. Consequently, the actual feature dimensions may be well below the wavelength of currently used light sources provided in current lithography systems. For example, presently in critical lithography steps, an exposure wave-length of 193 nm may be used, which, therefore, may require complex techniques for finally obtaining resist features having dimensions well below the exposure wavelength. Thus, highly non-linear processes are typically used to obtain dimensions below the optical resolution. For example, extremely non-linear photoresist materials may be used, in which a desired photochemical reaction may be initiated on the basis of a well-defined threshold so that weakly exposed areas may not substantially change at all, while areas having exceeded the threshold may exhibit a significant variation of their chemical stability with respect to a subsequent development process.

Consequently, significant advances and development of appropriate photoresist materials in combination with the progresses made in providing highly complex imaging tools may enable the printing of features having critical dimensions that are significantly less compared to the exposure wavelength used. Moreover, additional process techniques may be applied, which enable a further reduction of the resist features, thereby even further reducing the critical dimensions of circuit elements. For example, appropriate hard mask features may be formed on the basis of sophisticated trim etch techniques having a width of approximately 50 nm, thereby enabling the patterning of gate electrode structures having a gate length that substantially corresponds to the width of the mask features. Upon further reducing the overall dimensions of sophisticated semiconductor devices, not only the length of the gate electrode structure has to be reduced, for instance to 50 nm and less, but also the width of the gate electrode structures has to be reduced to several hundred nanometers and significantly less, in particular in densely packed device areas, such as static RAM areas in complex semiconductor devices. In this case, sophisticated trim etch techniques may not allow an appropriate reduction of the gate width. For this reason, and due to the fact that critical lithography processes may be controlled more efficiently by having to print resist features, which have a critical dimension in one lateral direction only, it has been proposed to split the patterning process for providing appropriate resist features for sophisticated gate electrode structures into two steps in order to appropriately adjust the gate length, for instance on the basis of trim etch techniques, and the gate width, thereby allowing reduced transistor width, as is frequently required in critical device areas, such as RAM areas. It turns out, however, that, upon further shrinkage of the overall device dimensions, the two-step patterning process for forming the mask features for the gate electrode structures may suffer from reduced scalability and controllability, in particular during the patterning step for defining the gate width, as will be described in more detail with reference to FIGS. 1a-1j.

FIG. 1a schematically illustrates a top view of a typical layout or an actual implementation of a semiconductor device 100, which may have to be formed on the basis of reduced transistor dimensions. As illustrated, the semiconductor device 100 may comprise active regions 102A, 102B, which are to be understood as semiconductor regions in and above which one or more transistors are to be formed. Typically, the active regions 102A, 102B are laterally delineated by an isolation structure or region 102C, such as a silicon dioxide region and the like. Furthermore, a plurality of gate electrode structures 160 are provided above the active regions 102A, 102B in accordance with the general layout of the semiconductor device 100, as is, for instance, required in a densely packed device region. For example, the gate electrode structures 160 may comprise gate electrode structures 160A, 160B, 160C, 160D, which may have a gate length 160L that is typically 50 nm and less in sophisticated semiconductor devices. In densely packed device areas, the gate electrode structures 160, such as the gate electrode structures 160A, 160B, have to be provided with a minimum lateral offset or pitch, which may by 100 nm and less, depending on the overall device requirements. As discussed above, typically, the width of corresponding transistors and thus the width, indicated by W, of the gate electrode structures 160, has to be reduced, thereby also requiring a lateral distance or offset in the width direction, as indicated by 160P, which may be the same order of magnitude as the gate length 160L in sophisticated applications. For example, the lateral distance 160P may be selected so as to allow a certain overlap with the isolation region 102C while at the same time reliably isolating the various gate electrode structures from each other. Consequently, upon further reducing the overall dimensions, for example, the width of the isolation structure 102C, the lateral distance 160P may also represent a very critical dimension in forming the gate electrode structures 160. Consequently, strategies have been proposed in which the gate length 160L may be defined by performing the first patterning process, followed by a further patterning process, in which the lateral distance 160P may be implemented.

FIG. 1b schematically illustrates a top view of the device 100, when performing a two-step patterning process for forming the gate electrode structures 160 as shown in FIG. 1a. As illustrated, in this manufacturing stage, mask features 111A, 111B may be formed above the mask layer 110, which may represent any appropriate hard mask material, such as silicon dioxide, silicon nitride and the like, which may result in a significantly reduced etch rate compared to an actual gate electrode material, such as polysilicon and the like. The mask features 111A, 111B may be provided in the form of resist features, which may be obtained on the basis of sophisticated lithography techniques in combination with any additional etch trim processes and the like in order to determine the lateral size and position of the gate electrode structures 160, however, without determining the width thereof. This may be accomplished by a further lithography and patterning process, in which a mask opening 111D may be formed in the mask layer 110, thereby "cutting" the gate electrode structures 160 defined by the size and position of the resist features 111A, 111B into gate electrode portions of a desired width, as is shown in FIG. 1a. A corresponding process for forming the mask features 111A, 111B and the mask opening 111D and a subsequent patterning process for forming the actual gate electrode structures 160A, 160B, 160C, 160D (FIG. 1A) will now be described in more detail with reference to FIGS. 1c-1j.

FIG. 1c schematically illustrates a perspective view of the semiconductor device 100 comprising a substrate 101, such as a silicon material, an SOI substrate and the like. Furthermore, a semiconductor layer 102, such as a silicon layer, may be provided above the substrate 101 and may comprise a plurality of active regions and isolation structures, as is also described above with reference to FIG. 1a. Furthermore, a gate dielectric material 161, for instance in the form of silicon dioxide, silicon oxynitride and the like, is formed above the semiconductor layer 102, followed by an electrode material 162, such as a polysilicon material and the like. The mask layer 110, which may comprise a plurality of sub-layers, depending on process specifics and the like, is formed above the electrode material 162. Moreover, in the manufacturing stage shown, the mask features 111A, 111B are formed on the mask layer 110. For example, the mask features 111A, 111B may be comprised of a resist material.

The semiconductor device 100 as illustrated in FIG. 1c may be formed on the basis of the following process strategies. The semiconductor layer 102 may be patterned to receive appropriate isolation structures, such as the isolation region 102C of FIG. 1A, which may be accomplished by sophisticated lithography, etch, deposition and planarization techniques. In this manner, also any active regions in the semiconductor layer 102 may be laterally delineated and may be subsequently treated to adjust the desired basic transistor characteristics by incorporating an appropriate well dopant species and the like. Next, the gate dielectric material 161 may be formed, for instance, by oxidation, deposition and the like, followed by the deposition of the electrode material 162, using well-established low pressure chemical vapor deposition (CVD) techniques and the like. Thereafter, the hard mask layer 110, which may comprise two or three sub-layers, and the like, may be deposited on the basis of appropriate deposition techniques. For example, silicon dioxide, silicon nitride, amorphous carbon and the like may be efficiently used as hard mask materials. Next, an appropriate material system including a resist material may be formed and exposed by using sophisticated lithography techniques. The resist material may then be developed and further treated so as to adjust the desired gate length, as discussed above with reference to FIGS. 1a and 1b. To this end, well-established trim etch techniques may be applied. Consequently, the further processing may be continued on the basis of the resist features 111A, 111B, having the target gate length, while, on the other hand, the width still to be defined on the basis of a further lithography process.

FIG. 1d schematically illustrates the device 100 after an etch process for patterning the mask layer 110 on the basis of the resist features 111A, 111B. Consequently, corresponding mask features 110A, 110B in the form of hard mask features may be provided and may thus have a desired gate length. To this end, any well-established anisotropic etch techniques, such as reactive ion etching and the like, may be used.

FIG. 1e schematically illustrates the semiconductor device 100 after the removal of the mask features 111A, 111B (FIG. 1D), which may be accomplished by applying plasma-assisted and/or wet chemical etch processes. In this stage, the device 100 may be prepared for a further critical lithography process in order to "cut" the hard mask features 110A, 110B so as to have the desired target width. To this end, appropriate materials such as optical planarization materials may be applied so as to provide a substantially planar surface topography, followed by the deposition of a resist material, possibly in combination with an additional anti-reflective coating (ARC) material and the like. Next, a lithography process may be performed on the basis of a lithography mask, which may define the lateral size and position of a trench to be formed in the resist material, which in turn may define the lateral distance 160P (FIG. 1a) in accordance with the device requirements.

FIG. 1f schematically illustrates the device 100 with corresponding opening or trench 112O formed in a material system 112, which may comprise a resist material, an ARC material in combination with a planarization material, as discussed above. Due to the aggressive scaling of transistor devices, the width of the trench 112O, which may thus define the lateral distance 160P (FIG. 1a), may represent a critical dimension and may have to be provided at the limit of the solution capabilities of sophisticated lithography processes. Consequently, upon further device scaling, the width of the opening 112O may not allow further reduction of the lateral distance 160P (FIG. 1a), unless significant efforts may be made, for instance, for developing new resist materials, further improving the optical characteristics of the complex lithography systems, or implement specific etch techniques upon forming the opening 112O and/or upon etching through the mask features 110A, 110B.

FIG. 1g schematically illustrates the semiconductor device 100 after forming a mask opening 110O on the basis of the opening 112O (FIG. 1O by etching through the exposed portions of the mask features 110A, 110B. In some conventional approaches, the above indicated limitations upon forming the opening 112O (FIG. 1O may be overcome by applying sophisticated etch techniques in order to actually reduce the lateral size of the opening 110O, thereby also reducing the lateral distance 160P of FIG. 1a. For example, complex polymerization components may be added to the plasma based etch chemistry in order to create a certain "deposition" behavior during the etch process at sidewalls of the openings 110O, thereby also reducing the lateral distance between isolated portions of the mask features 110A, 110B. Although a further reduction of the critical dimensions, i.e., the lateral distance 160P of FIG. 1a, may be accomplished, it turns out that extremely complex process parameters may have to be controlled, which may, however, result in significant variations.

FIG. 1h schematically illustrates the device 100 after the removal of the material system 112 (FIG. 1g). Thus, as illustrated, a plurality of isolated mask features 110A, 110B, 110C, 110D are provided, which may have a desired gate length, for instance as defined by the resist features 111A, 111B of FIG. 1c, while the lateral distance 160P (FIG. 1a) may be obtained as defined by the opening 112O of FIG. 1f.

FIG. 1i schematically illustrates the semiconductor device 100 in a further advanced manufacturing stage, in which the plurality of gate electrode structures 160A160B, 160C, 160D are formed on the basis of any appropriate anisotropic etch technique, in which the mask features 110A, 110B, 110C, 110D (FIG. 1h) are used as an efficient etch mask.

FIG. 1j schematically illustrates the semiconductor device 100 in a further advanced manufacturing stage, in which the gate dielectric material 161 is also patterned, which may be accomplished in a separate etch process on the basis of any well-established etch techniques.

Consequently, the arrangement of the isolated gate electrode structures 160A160B, 160C, 160D may be obtained on the basis of two different patterning sequences, each including a specific lithography process and an etch process in order to provide the hard mask features 110A, 110B, 110C, 110D (FIG. 1h), wherein the gate length may be determined on the basis of etch trim techniques, while, however, the lateral distance 160P (FIG. 1A) may be increasingly difficult to be implemented upon further device scaling. On the other hand, sophisticated etch techniques, for instance using polymerizing gases during the etch process for transferring the opening 112O (FIG. 1f) into the underlying mask features may result in significant device variations, while other approaches, such as improving the resist materials and/or the optical imaging system, may require significant research and development improvements and any such improvements are not yet available.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices and manufacturing techniques in which circuit features, such as gate electrode structures, may be provided on the basis of an appropriate lithography and patterning regime, in which the respective lateral dimensions may be defined with superior controllability and scalability. To this end, the lateral dimensions of a mask opening may be reduced, for instance by forming a spacer element on inner sidewalls thereof, in order to determine the lateral dimensions of circuit features in one direction. Thereafter, appropriate mask features may be formed above the underlying mask layer including the mask opening of reduced lateral dimensions. The mask opening may thus define a lateral separation of the mask features. On the other hand, the width of the mask features, which may, for instance, correspond to a desired gate length, may be adjusted by using any appropriate process technique, such as trim etch techniques. Consequently, upon transferring the mask features into the underlying mask layer, the desired lateral dimensions in both lateral directions may be obtained in the mask layer with a high degree of controllability and superior uniformity compared to conventional strategies. Consequently, circuit features and, in some illustrative embodiments, gate electrode structures may be formed with a desired gate length and also with a reduced lateral distance in the width direction, wherein well-controllable process techniques may be applied, thereby contributing to superior device uniformity and reduced overall process complexity compared to conventional approaches.

One illustrative method disclosed herein relates to forming circuit features of a semiconductor device. The method comprises forming an elongated mask opening in a mask layer that is formed above one or more material layers of the semiconductor device, wherein the mask opening has a first width and a first length. The method further comprises forming a spacer element on inner sidewalls of the mask opening so as to reduce the first width. Additionally, the method comprises forming an elongated resist mask feature above the mask layer, wherein the resist mask feature has a second width and a second length and extends along a length direction thereof across the mask opening in the width direction thereof, wherein the mask opening has the reduced first width. The method further comprises forming a mask feature in the mask layer by using the resist mask feature and the mask opening. Furthermore, the method comprises forming a first circuit feature and a second circuit feature from the one or more material layers by using the mask features as an etch mask.

A further illustrative method disclosed herein relates to forming gate electrode structures of a semiconductor device. The method comprises reducing lateral dimensions of a mask opening that is formed in a mask layer, which in turn is formed above a gate layer stack. The method further comprises forming a first mask feature above the mask layer and above the mask opening, wherein the first mask feature defines a gate length of gate electrode structures to be formed from the gate layer stack, wherein the mask opening with the reduced lateral dimensions defines a pitch of the gate electrode structures in a lateral direction perpendicular to the gate length. Moreover, the method comprises forming second mask features from the mask layer by using the first mask feature and the mask opening as an etch mask. Additionally, the method comprises forming the gate electrode structures by performing an etch process and using the second mask features as a further etch mask.

One illustrative semiconductor device disclosed herein comprises a first gate electrode structure having a first tip portion formed above an isolation region. The semiconductor device further comprises a second gate electrode structure having a second tip portion that is formed above the isolation region. The first and second gate electrode structures have a gate length of approximately 50 nm or less and comprise an electrode material having a recess that is formed locally in the first and second tip portions.

BRIEF DESCRIPTION OF THE DRAWINGS

The disclosure may be understood by reference to the following description taken in conjunction with the accompanying drawings, in which like reference numerals identify like elements, and in which:

FIGS. 1c-1j schematically illustrate perspective views of the semiconductor device during various manufacturing stages in forming gate electrode structures by first providing mask features defining the gate length and subsequently forming an opening that defines the gate width, according to conventional strategies;

FIG. 2b schematically illustrates a cross-sectional view of the semiconductor device as shown in FIG. 2a;

Figure 1A:
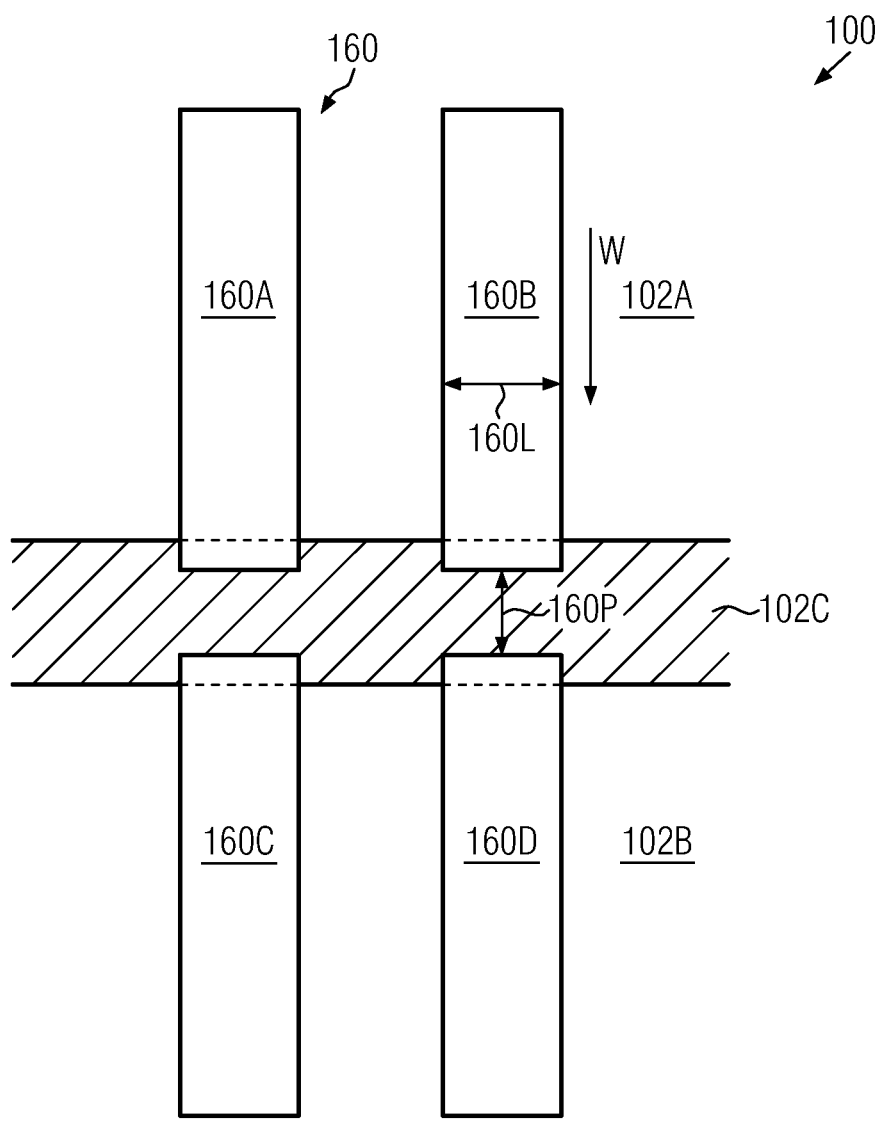
FIG. 1a schematically illustrates a top view of a semiconductor device comprising a plurality of closely spaced gate electrode structures.
Figure 1B:
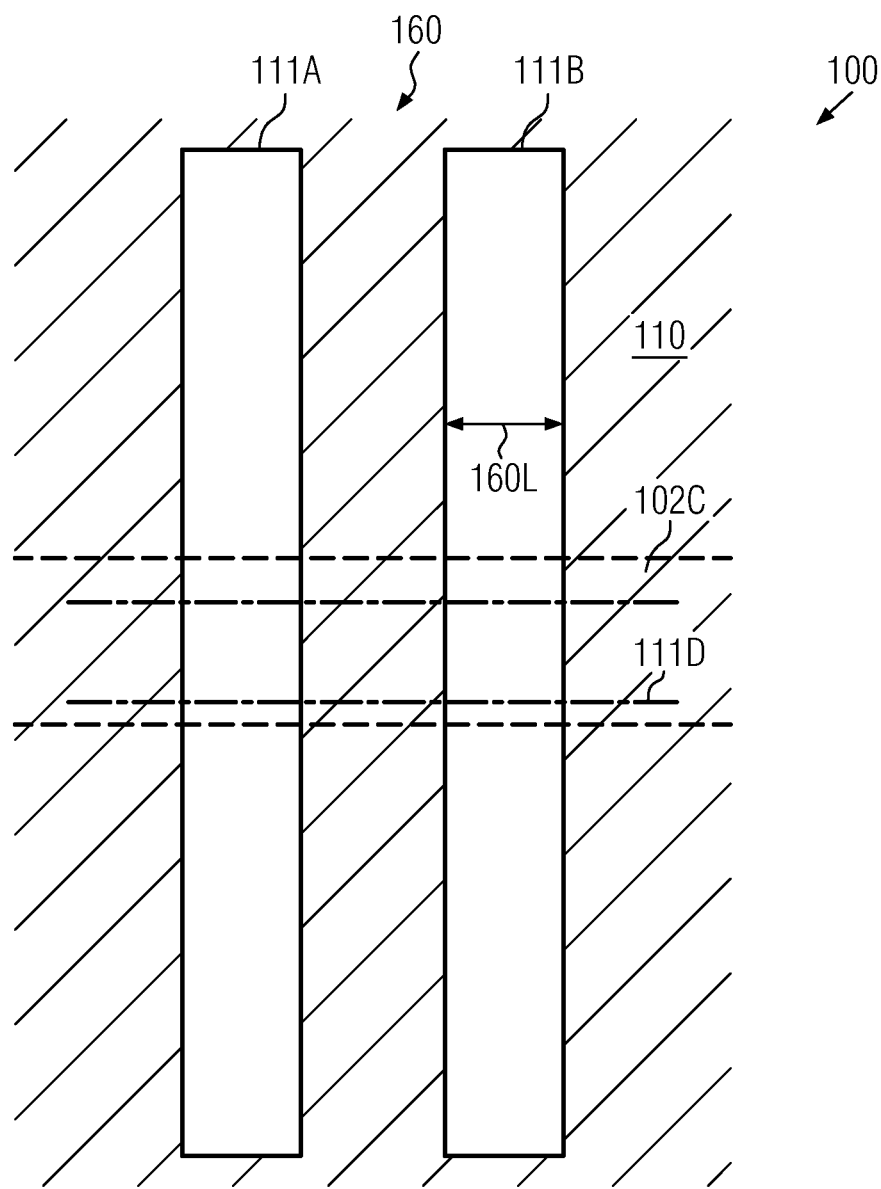
FIG. 1b schematically illustrates a top view illustrating a strategy for forming the plurality of gate electrode structures on the basis of a double exposure double etch patterning regime.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides semiconductor devices and manufacturing techniques in which critical circuit elements, such as line-like features, for instance in the form of gate electrode structures, may be formed on the basis of a double exposure double etching sequence, wherein a mask opening may be formed in a hard mask material in order to appropriately define the lateral distance of the circuit features in one lateral direction, such as the width direction of gate electrode structures, which may be accomplished by using deposition and etching techniques for defining the desired critical dimension in this lateral direction. Thereafter, the hard mask layer may further be patterned by using appropriate mask features, which may be formed above the hard mask layer and the opening formed therein, and which may define the lateral dimensions in the perpendicular lateral direction, such as the gate length direction. In this manner, superior process control may be accomplished in defining the lateral dimensions of the mask opening, since controllable deposition techniques may be applied in combination with appropriate anisotropic etch processes. Consequently, gate electrode structures may be provided with a reduced lateral distance along the gate width direction, while nevertheless providing superior device uniformity and process controllability without unduly increasing overall complexity, compared to conventional strategies.

Figure 2A:
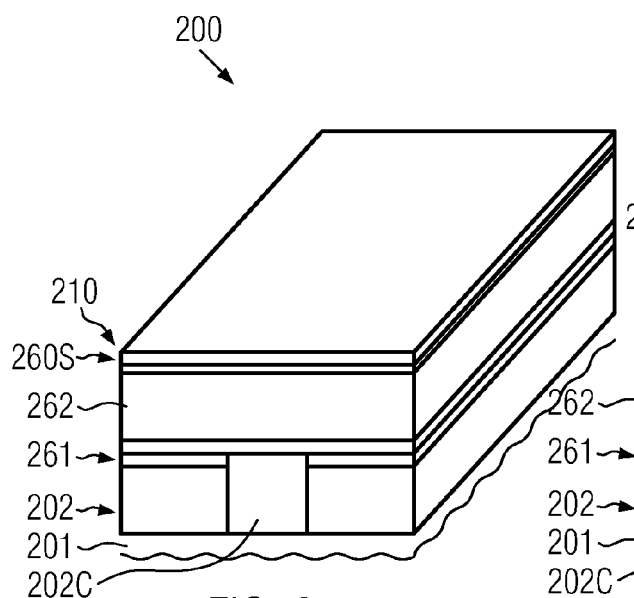
FIG. 2a schematically illustrates a perspective view of a semiconductor device during a manufacturing stage for forming circuit features, such as gate electrode structures, by using an appropriate layer stack.
Figure 2C:
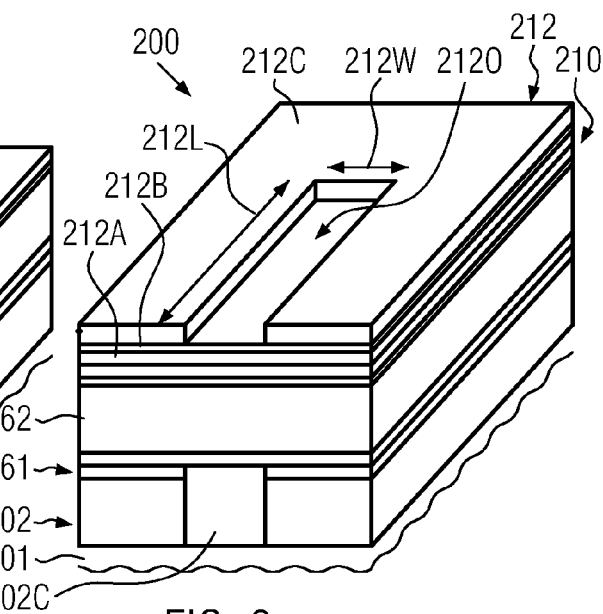
FIGS. 2c-2e schematically illustrate perspective views of the semiconductor device during various manufacturing stages in forming a mask opening for defining a lateral distance of circuit features, such as gate electrode structures, in a gate width direction prior to determining any mask features for defining the gate length dimensions, according to illustrative embodiments.
Figure 2D:
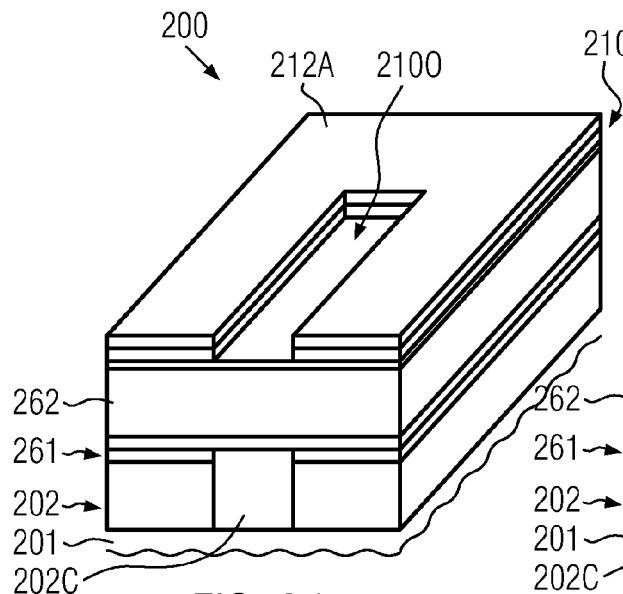
Figure 2E:
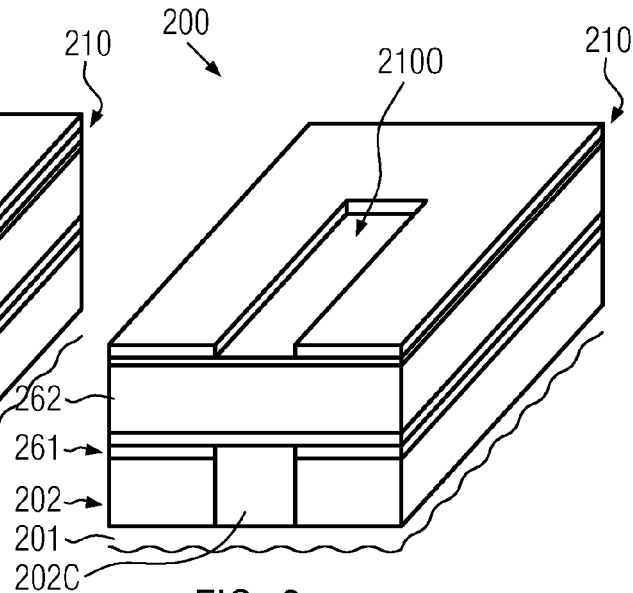
Figure 2B:
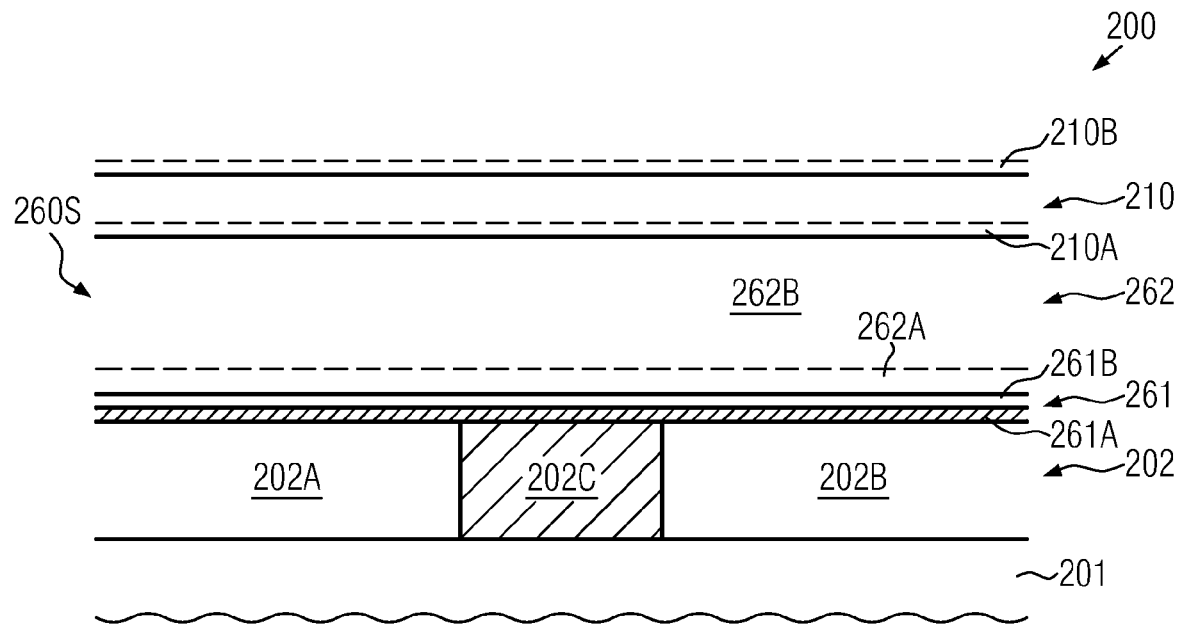
Figure 2F:
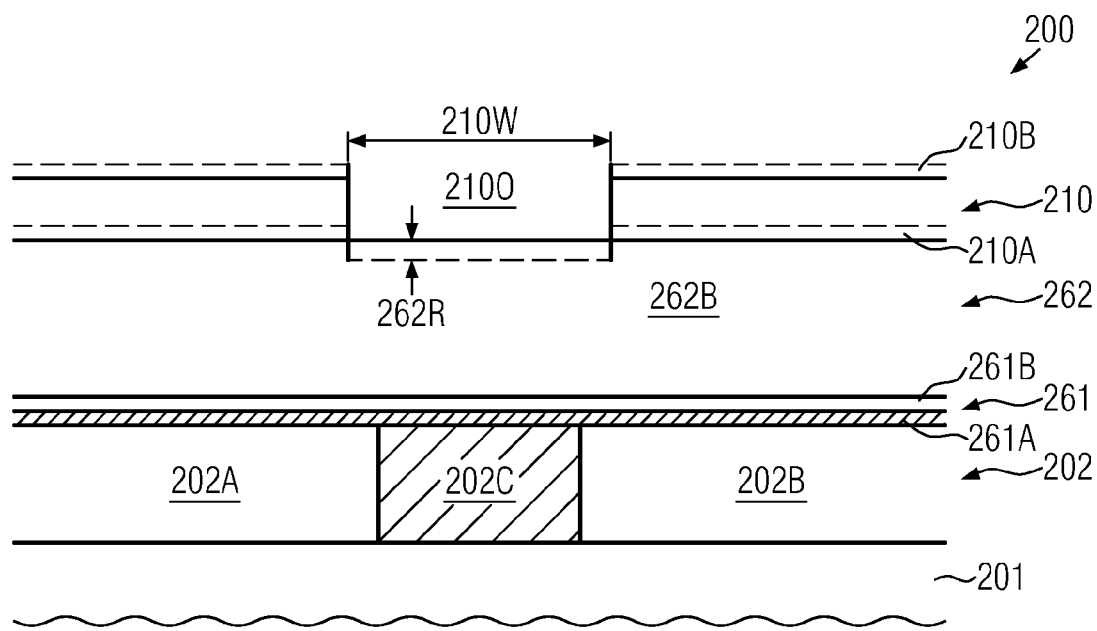
FIG. 2f schematically illustrates a cross-sectional view of the semiconductor device as shown in FIG. 2e.
Figures 2G, 2I:
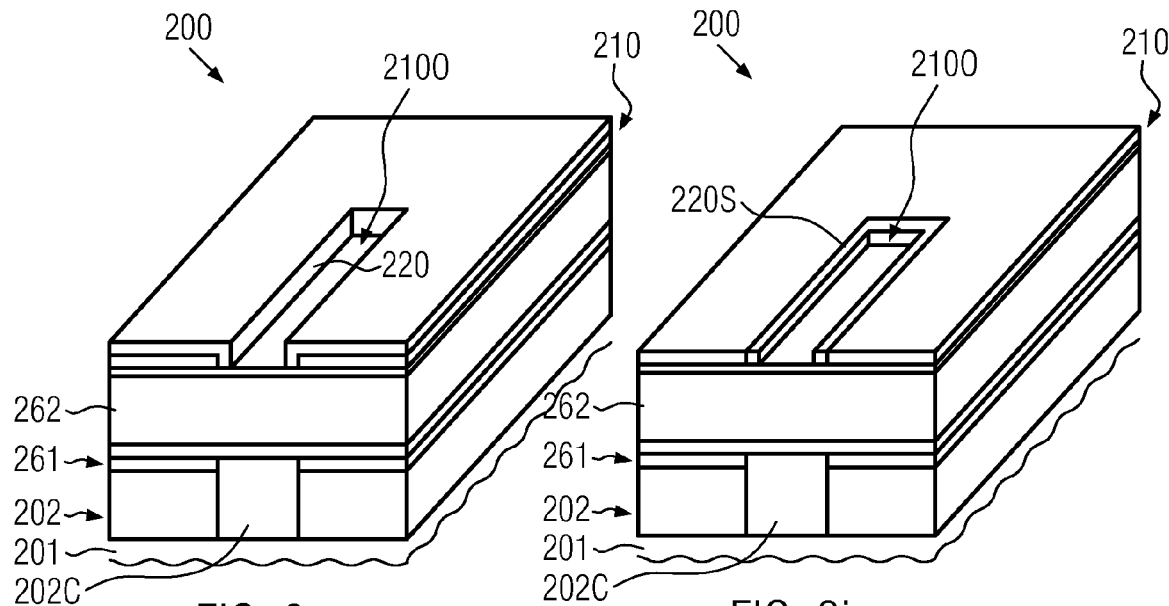
FIGS. 2g and 2h schematically illustrate a top view and a cross-sectional view, respectively, of the semiconductor device with a spacer layer to reduce the lateral dimensions of the mask opening, according to illustrative embodiments.
FIGS. 2i and 2j schematically illustrate a perspective view and a cross-sectional view, respectively, of the semiconductor device with sidewall spacers formed on inner sidewalls of the mask opening, according to illustrative embodiments.
Figures 2K, 2L:
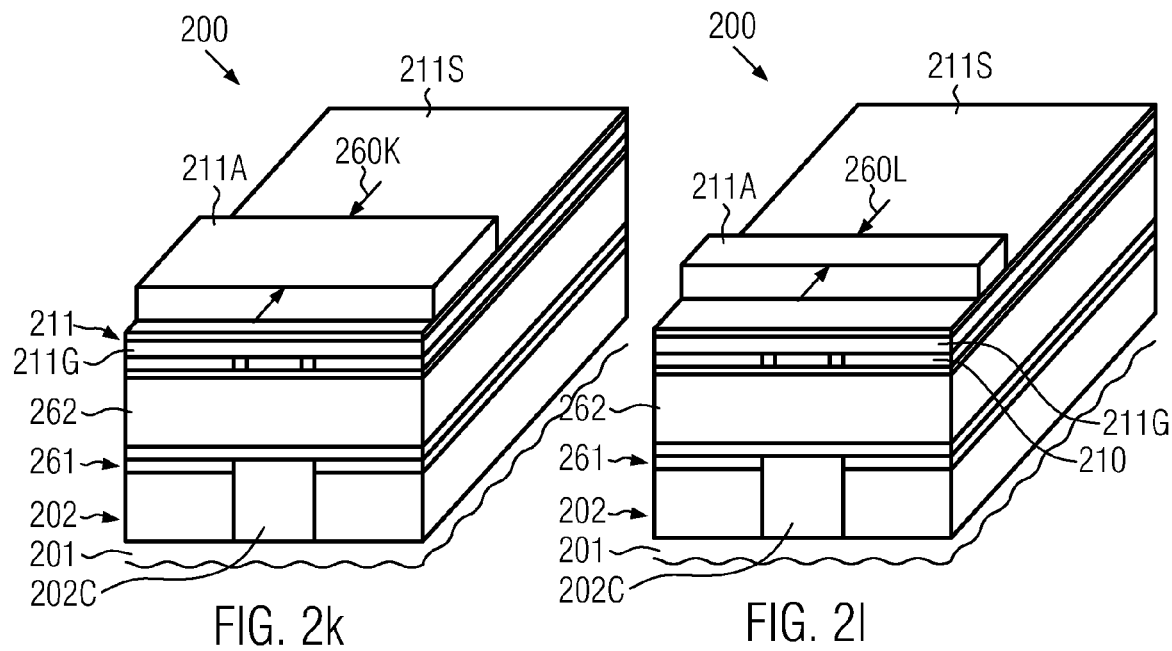
FIGS. 2k-2p schematically illustrate perspective views of the semiconductor device during various manufacturing stages in providing a mask feature for defining a critical dimension, such as the gate length, according to illustrative embodiments.
Figure 2H:
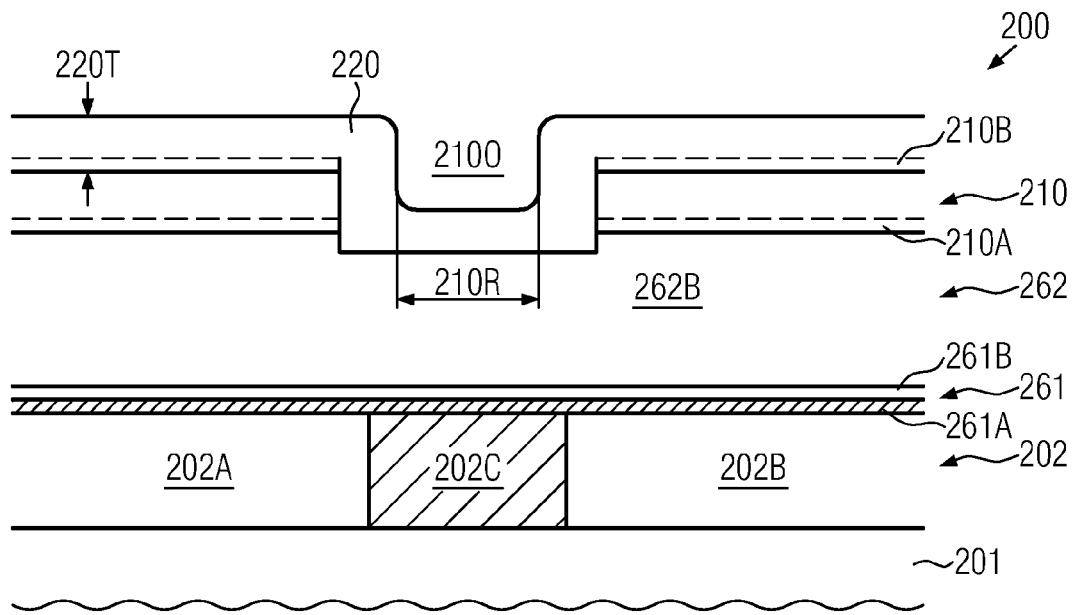
Figure 2J:
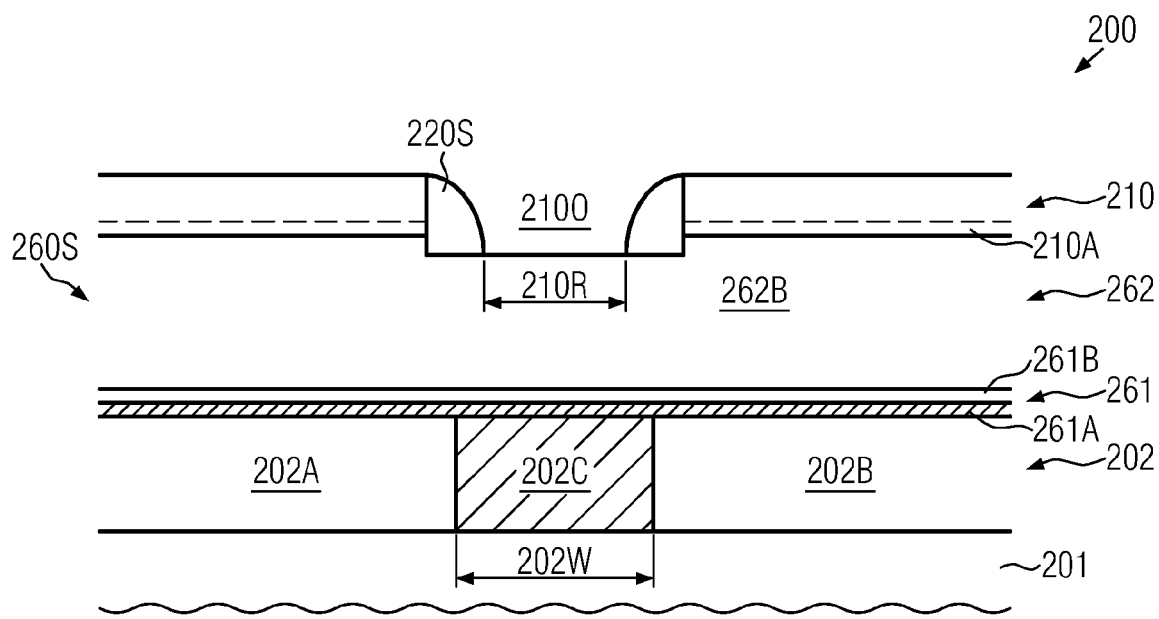
Figures 2M, 2N:
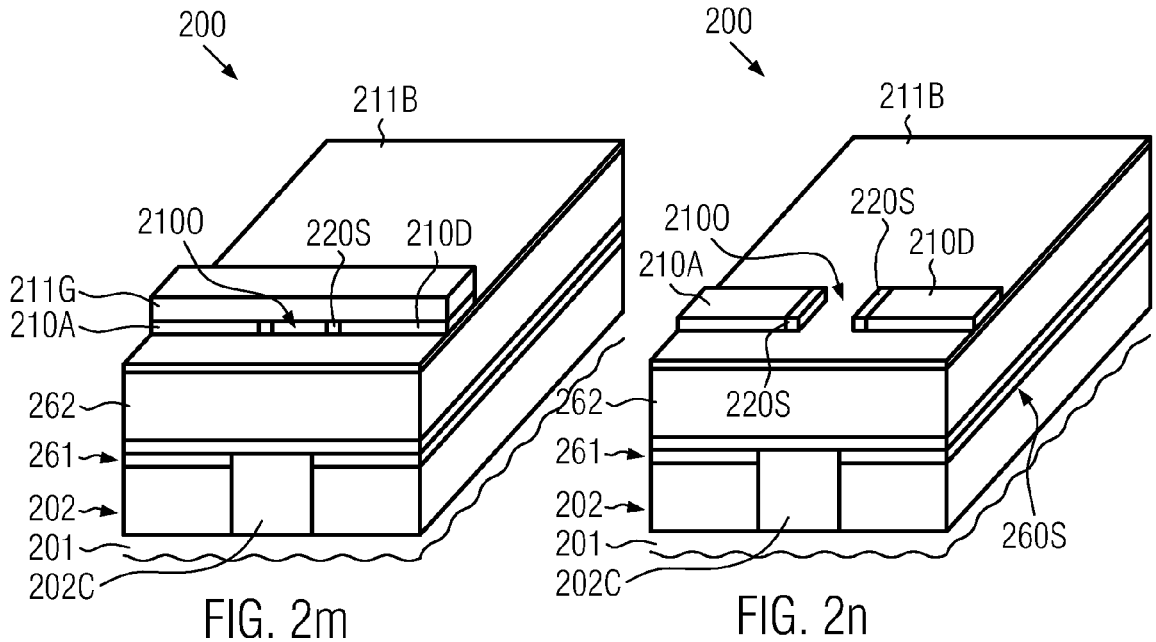
Figures 2O, 2P:
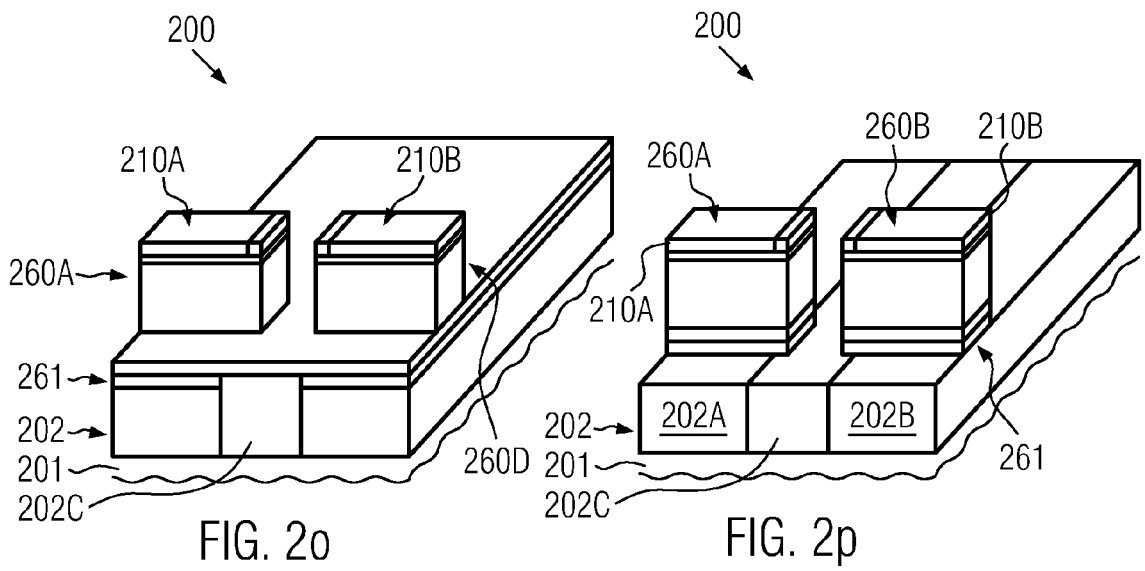
Figure 2Q:
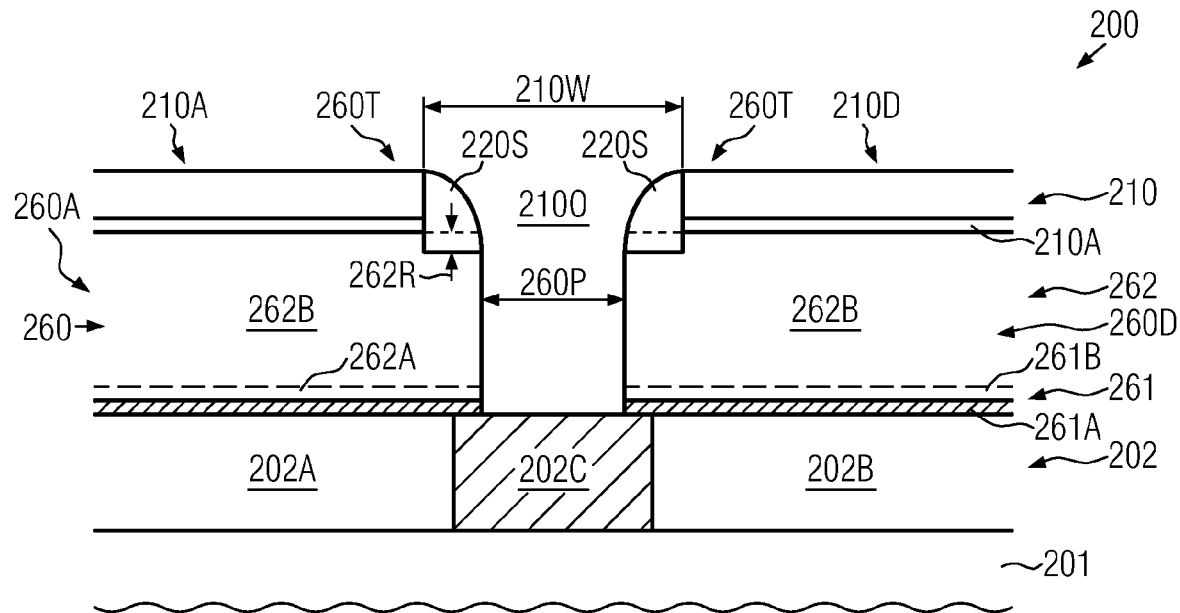
FIG. 2q schematically illustrates a cross-sectional view of the semiconductor device of FIG. 2p, wherein a recess configuration of the electrode material at tip portions of the gate electrode structures is illustrated.
Figure 2R:
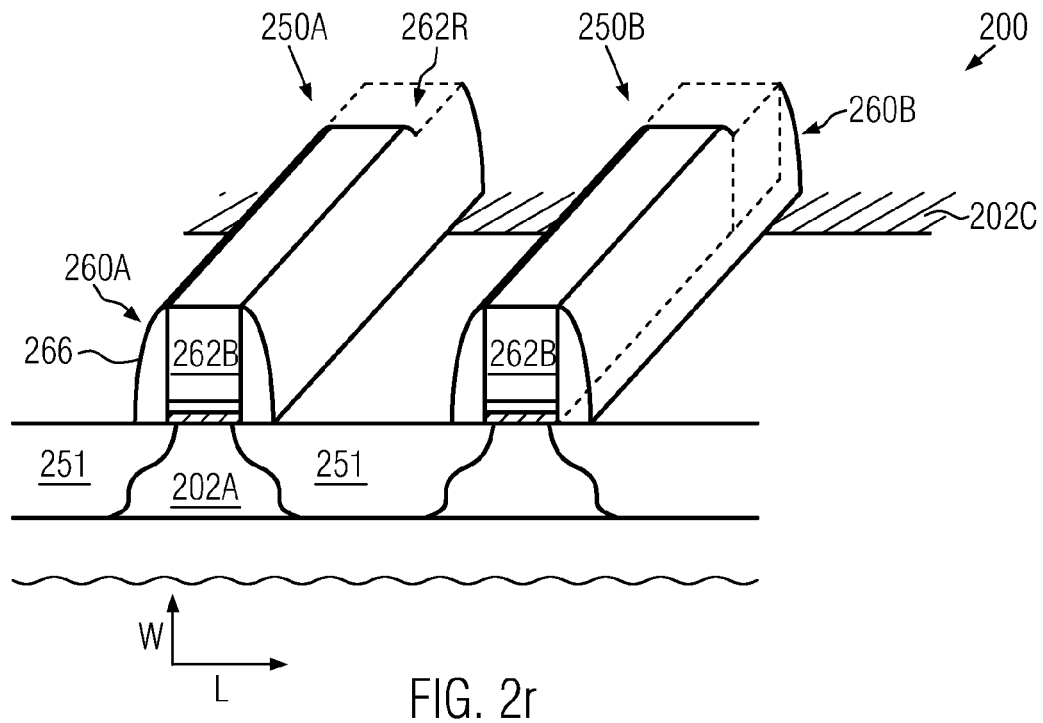
FIG. 2r schematically illustrates a perspective view of the semiconductor device in a further advanced manufacturing stage, in which transistors may be formed on the basis of the previously patterned gate electrode structures, according to illustrative embodiments.

With reference to FIGS. 2a-2r, further illustrative embodiments will now be described in more detail, wherein reference may also be made to FIGS. 1a-1j, if appropriate.

FIG. 2a schematically illustrates a perspective view of a semiconductor device 200 in a process stage in which a gate electrode structure is to be formed from a gate layer stack 260S. In this manufacturing stage, the semiconductor device 200 may comprise a substrate 201 in combination with a semiconductor layer 202, which may form an SOI configuration or a bulk configuration depending on the overall device requirements. For example, a buried insulating material (not shown) may be formed below the semiconductor layer 202 in order to provide an SOI architecture. On the other hand, the semiconductor layer 202 may be formed on a crystalline material of the substrate 201 in a bulk configuration. Furthermore, the semiconductor layer 202 may comprise a plurality of active regions, which may be laterally delineated by an isolation structure 202C. The layer stack 260S, which may represent a gate layer stack in some illustrative embodiments, may comprise a dielectric material 261, followed by an electrode material 262. Furthermore, a mask layer 210 may be formed above the layer stack 260S and may have any appropriate configuration. For example, the mask layer 210 may comprise a silicon nitride material, a silicon dioxide material and the like.

FIG. 2b schematically illustrates a cross-sectional view of the semiconductor device 200 as shown in FIG. 2a. As illustrated, active regions 202A, 202B may be provided in the semiconductor layer 202 and may be laterally delineated by the isolation structure 202C. Moreover, the dielectric layer 261, which may represent a gate dielectric material in the embodiment shown, or which may at least represent an appropriate etch stop material, may be provided in the form of one or more dielectric materials. For example, in sophisticated applications, gate electrode structures may be formed on the basis of a high-k dielectric material in order to reduce unwanted gate leakage currents while at the same time providing high controllability of the corresponding transistor elements. A high-k dielectric material may generally be understood as any dielectric material, i.e., any insulating material, having a dielectric constant of 10.0 and higher. For example, a plurality of metal oxides may provide the required insulating characteristics and may have a moderately high dielectric constant, such as hafnium oxide, zirconium oxide, aluminum oxide and the like. For example, a high-k dielectric material layer 261B may be provided in the dielectric layer 261, possibly in combination with a "conventional" dielectric material 261A, such as a silicon dioxide-based material and the like. In sophisticated applications, the layer 261A, if provided, may have a thickness of 1 nm or less, while the layer 261B may have a thickness of one to several nanometers. Moreover, the electrode material 262 may be provided in the form of a polysilicon material, an amorphous silicon material, a silicon/germanium material and the like, while in some illustrative embodiments, as shown in FIG. 2b, a metal-containing cap material 262A may be provided in order to appropriately confine the dielectric material 261. For example, titanium and nitrogen-containing materials are frequently used as a base material for providing a conductive cap layer. Furthermore, the mask layer 210 provided above the layer stack 260S may be provided together with additional materials, such as etch stop layers 210A, 210B, and the like. For example, the mask layer 210 may be substantially comprised of silicon nitride, silicon dioxide and the like, while the etch stop or etch control layers 210A, 210B, if provided, may have a different material composition in order to enable an efficient stopping of an etch process and/or to release a well-detectable species during a corresponding etch process, thereby providing a reliable etch stop signal, which may then be used for controlling any etch processes to pattern the mask layer 210.

The semiconductor device 200 as illustrated in FIG. 2b may be formed on the basis of any appropriate process strategy. For example, the active regions 202A, 202B and the isolation region 202C may be formed by using process techniques as described above. Similarly, the dielectric layer 261 may be formed by oxidation and/or deposition, depending on the materials required in the layer 261. Similarly, the cap layer 262A, if provided, may be formed by any appropriate deposition technique, wherein, in some cases, additional patterning regimes may be applied so as to provide an appropriate work function species in and above the dielectric layer 261, depending on the type of transistor to be formed in and above the active regions 202A, 202B. Thereafter, the layers 262B and the mask layer 210, possibly in combination with the layers 210A, 210B may be formed on the basis of any appropriate deposition technique.

FIG. 2c schematically illustrates the device 200 in a further advanced manufacturing stage. As illustrated, a further mask layer system 212 may be formed above the mask layer 210 and the system 212 may comprise an opening 212O, which may generally be aligned to the isolation structure 202C. The opening 212O may also be considered as an elongated opening having an initial width 212W and an initial length 212L. The material system 212 may comprise a plurality of individual material layers, such as a layer 212A, which may be provided in the form of an organic ARC or planarization material, followed by an ARC layer 212B, such as a silicon-containing ARC material, followed by a resist layer 212C. In the manufacturing stage shown, the opening 212O may be formed in the resist layer 212C, which may be accomplished on the basis of sophisticated lithography techniques. Consequently, in particular the critical width 212W of the opening 212O may be formed so as to comply with the resolution capabilities of the lithography technique under consideration. On the basis of the resist material 212C comprising the opening 212O, a further patterning process may be applied so as to transfer the opening 212O into the layer 212B and finally into the layer 212A, which may then be used as a mask layer for performing a further etch process.

FIG. 2d schematically illustrates the semiconductor device 200 in a further advanced manufacturing stage, in which the layer 212A may be used as an etch mask for transferring the corresponding opening into the underlying mask layer 210, thereby forming a mask opening 210O, which may have substantially the lateral dimensions of the opening 212O as shown in FIG. 2c. Consequently, upon forming the opening 210O, well-established anisotropic etch strategies may be applied, thereby avoiding sophisticated polymerizing etch processes and the like, which may conventionally be applied for reducing the lateral dimensions of a corresponding opening for defining the lateral distance in the width direction of sophisticated gate electrode structures.

FIG. 2e schematically illustrates the semiconductor device 200 after the removal of the layer 212A of FIG. 2d. Consequently, the mask opening 210O may be provided in the mask layer 210, wherein, as previously discussed, in some illustrative embodiments, the corresponding etch process may be controlled on the basis of an etch stop material, as. for instance, shown in FIG. 2f in the form of the layer 210A.

FIG. 2f schematically illustrates a cross-sectional view of the device 200 as illustrated in FIG. 2e. As depicted, the opening 210O may be formed in the mask layer 210, and possibly in layer 210B, if provided. Furthermore, during the preceding etch process, the layer 210A, if provided, may have been used as an etch control material, which may typically result in the release of appropriate atomic species into the reactive plasma atmosphere, thereby providing a prominent endpoint detection signal, which may thus be efficiently used for process control of the corresponding etch process. In some illustrative embodiments, as illustrated in FIG. 2*f*, the layer 210A may be provided with a reduced thickness, which may result in superior process conditions upon forming a mask layer 210, while nevertheless providing a pronounced endpoint detection signal. During the etch process for forming the opening 210O, the etch process may etch through the layer 210A and may etch into the electrode material 262B, thereby forming a recess 262R. In other cases, the etch control layer 210A may be omitted, which may result in a somewhat increased depth of the recess 262R, however, without unduly affecting the further processing of the device 200. Consequently, the opening 210O may have an initial width 210W, which may substantially correspond to the width 212W of FIG. 2C.

FIG. 2G schematically illustrates the device 200 in a further advanced manufacturing stage, in which a spacer layer 220 with any appropriate material composition may be formed above mask layer 210 and within the opening 210O.

FIG. 2*h* schematically illustrates a cross-sectional view of the device 200 of FIG. 2*g*. As shown, the spacer layer 220 may be provided with a desired thickness 220T by using well-controllable and well-established deposition techniques, such as thermally activated CVD techniques, plasma enhanced CVD techniques and the like. Consequently, the spacer layer 220 may also be formed in a highly conformal manner within the opening 210O, thereby reducing the width thereof. As indicated, the width 210R may be obtained on the basis of the spacer layer 220, which may be substantially determined by the initial width and the thickness 220T. Consequently, the reduced width 210R may be obtained on the basis of well-controllable process techniques, i.e., well-established lithography processes, highly anisotropic etch recipes and conformal deposition techniques. In some illustrative embodiments, the spacer layer 220 may be provided as a material having substantially the same etch characteristics as the mask layer 210, thereby providing superior process uniformity during the further processing, for instance upon removing the mask layer 210 in a later advanced manufacturing stage. In some illustrative embodiments, as shown, the spacer layer 220 may be formed on the layer 210B, which may act as an etch stop layer during the further process, when patterning the spacer layer 220. For example, silicon nitride material may be used in the spacer layer 220 and hence the layer 210B may be provided in the form of a silicon dioxide material. It should be appreciated, however, that any other material system may be applied. Moreover, in some illustrative embodiments, an etch stop material, for instance in the form of silicon dioxide, may be deposited prior to the deposition of the spacer layer 220, in which case a corresponding etch stop material may also be formed within the opening 210O. Consequently, in this case, reduced width 210R may also depend on the thickness of the corresponding etch stop material. Thereafter, any appropriate etch process may be applied so as to remove the material of the spacer layer 220 from horizontal surface portions while maintaining the material of the layer 220 at sidewalls of the layer 210. For example, any well-established spacer formation technique may be applied.

FIG. 2*i* schematically illustrates the semiconductor device 200 after the above-described process sequence. Hence, a spacer element 220S may be provided within the opening 210O.

FIG. 2*j* schematically illustrates a cross-sectional view of the device 200 with the spacer element 220S formed within the opening 210O. Hence, the width 210R may be defined by the spacers 220S, wherein any reduction in spacer width caused by the preceding etch process may also be taken into consideration when forming the spacer layer 220 with its initial thickness 220T (see FIG. 2*h*). In other cases, the initial thickness 220T may be substantially preserved when forming the spacer elements 220S. Consequently, the lateral distance of circuit features, such as gate electrode structures to be formed from the layer stack 260S, may be defined on the basis of the opening 210O having the reduced lateral dimension 210R.

With reference to FIGS. 2*k*-2*p*, further manufacturing stages will now be described, in which mask features may be formed from the mask layer 210, which may be appropriately separated by the opening 210O.

FIG. 2*k* schematically illustrates the semiconductor device 200 with a material system 211 having formed therein a mask feature 211A, for instance in the form of a resist feature. As illustrated, the material system 211 may comprise a planarization material 211G, such as an organic planarization material, as is typically used in sophisticated lithography processes. Moreover, a further ARC layer 211S, such as a silicon-containing ARC material and the like, may be provided, followed by a patterned resist layer in the form of the resist feature 211A. The resist feature 211A may be formed so as to extend across the opening 210O according to a width direction, i.e., along a direction parallel to the lateral dimension 210R (see FIG. 2*j*). On the other hand, the resist feature 211A may have a length dimension 260K, which may be obtained on the basis of sophisticated lithography techniques and which may have to be reduced in order to obtain a target length, such as a gate length, during the further processing. To this end, well-established trim etch techniques may be applied, in which material may be removed in a highly controllable manner, thereby reducing the lateral dimensions and, thus, in particular, the initial length 260K.

FIG. 2l schematically illustrates the semiconductor device 200 after the corresponding trim process. As shown, the resist feature 211A may now comprise a length dimension 260L, according to the required target dimension of, for instance, a gate electrode structure. Consequently, on the basis of the resist feature 211A, the material layers 211S and 211G may be patterned so as to transfer the resist feature 211A into these lower-lying material layers, which may then act as etch masks for patterning the mask layer 210. To this end, any well-established techniques may be applied for etching the layer 211S and using an appropriate etch chemistry for etching into and through the layer 211G. During the corresponding process, the resist feature 211A may be completely consumed, while the lateral dimensions thereof, however, may be reliably transferred into the underlying layers 211G, 211S. Next, at least the layer 211G may be used as an etch mask for patterning the layer 210.

FIG. 2*m* schematically illustrates the semiconductor device 200 after the above-described process sequence. Hence, the patterned layer 211G may cover corresponding mask features 210A, 210O, i.e., the residues of the mask layer 210, wherein the mask features 210A, 210D may be separated by the opening 210O having the reduced lateral dimensions due to the presence of the spacer elements 220S.

FIG. 2*n* schematically illustrates the semiconductor device 200 after the removal of material 211G (FIG. 2*m*), thereby providing the mask features 210A, 210D as isolated components, wherein a lateral distance between these features may be defined by the opening 210O comprising the spacer elements 220S. On the basis of the mask features 210A, 210D, the underlying layer stack 260S may be patterned in order to form circuit elements, such as gate electrode structures. That is, during the corresponding anisotropic patterning process, the lateral dimensions of the mask features 210A, 210D may be transferred into the layer stack 260S. Since the mask features 210A, 210D may have substantially the length dimension 260L (FIG. 2l), the circuit features, such as the gate electrode structures, may be provided with the target length dimension, while the separation in the perpendicular lateral direction may be accomplished on the basis of the opening 210O including the spacers 220S.

FIG. 2o schematically illustrates the semiconductor device 200 after a first patterning step for etching the layer stack 260S of FIG. 2n. As shown, a first gate electrode structure 260A covered by the mask feature 210A may be provided in combination with a second gate electrode structure 260D covered by the mask feature 210D. In the embodiment shown, the corresponding patterning process may be stopped on the dielectric material 261, which may be subsequently patterned in a further dedicated etch step.

FIG. 2P schematically illustrates the device 200 after the patterning of the dielectric layer 261, wherein the gate electrode structures 260A, 260D may still be covered by the mask features 210A, 210D.

FIG. 2Q schematically illustrates a cross-sectional view of the semiconductor device 200 in the manufacturing stage as shown in FIG. 2p. As illustrated, the gate electrode structure 260A may be formed above the active region 202A and may also extend above a certain portion of the isolation structure 202C. Similarly, the gate electrode structure 260D may be formed above the active region 202B and may also extend above a portion of the isolation structure 202C, wherein a lateral distance 260P, i.e., a distance along a width direction of the gate electrode structures 260A, 260D, may be determined by the spacer elements 220S and the initial width 210W as defined by the mask features 210A, 210D. Furthermore, as illustrated, the spacers 220S provided at a respective tip portion or end portion of the gate electrode structures 260A, 260D may extend into the electrode material 262B due to the recess 262R, which may have previously been formed upon forming the corresponding opening having the initial width 210W, as discussed above.

Based on the configuration as shown in FIG. 2q, the further processing may be continued in accordance with any appropriate process strategy. For example, the sidewalls of the gate electrode structures 260A, 260D may be covered by an appropriate liner material, if considered appropriate in view of preserving integrity of, for instance, the material 261 and the material 262A, if provided. Thereafter, in sophisticated applications, strain-inducing mechanisms may be implemented, for instance, by incorporating a strain-inducing material into active regions of at least one type of transistor, which may be accomplished by forming corresponding cavities and refilling the cavities with an appropriate semiconductor material, such as a silicon/germanium material and the like. In this case, the mask features 210A, 210D may be advantageously used as deposition masks for at least one type of transistor, wherein the spacer element 220S may also provide superior integrity of the tip portions 260T. At any appropriate manufacturing stage, the mask features 210A, 210D may be removed together with the spacer elements 220S, wherein a common removal process may be applied when the spacers 220S and the mask features 210A, 210D may have substantially the same etch behavior. In some illustrative embodiments, the electrical performance of the gate electrode structures 260A, 260D may further be improved by replacing at least the electrode material 262B with a highly conductive electrode metal, such as aluminum and the like. In other cases, in addition to replacing the material 262B, a high-k dielectric material may be provided after removing the electrode material 262B. In other cases, the dielectric material 261 may already comprise a high-k dielectric material and also an appropriate work function may have been adjusted in an early manufacturing stage, i.e., upon forming the initial layer stack 260S (FIG. 2a). In other illustrative embodiments, the gate electrode structures 260A, 260D may be provided in the form of "conventional" electrode structures comprising a silicon dioxide-based dielectric material in combination with a polysilicon material.

FIG. 2r schematically illustrates the semiconductor device 200 in a further advanced manufacturing stage. As illustrated, a first transistor 250A may be formed above the active region 202A and may comprise the gate electrode structure 260A. Similarly, a second transistor 250B may be formed laterally adjacent to the transistor 250A and may comprise a gate electrode structure 260B. The gate electrode structures 260A, 260B may be formed in accordance with process techniques as described above and may, thus, comprise the recessed portions 262R in the electrode material 262B due to the specific patterning sequence as described above. Moreover, the gate electrode structures 260A, 260B may comprise a sidewall spacer structure 266, which may be used for defining an appropriate lateral and vertical dopant profile for drain and source regions 251. To this end, any well-established process technique may be applied.

Thus, the transistors 250A, 250B may be provided with desired dimensions in a width direction, indicated as W, and in a length dimension, indicated as L, wherein, in particular, lateral distance of transistors in the width direction and, thus, in particular, lateral distance of corresponding gate electrode structures may be efficiently implemented on the basis of the process techniques described above.

As a result, the present disclosure provides manufacturing techniques and semiconductor devices in which a double exposure, double patterning strategy may be applied for forming gate electrode structures or any other circuit elements formed from a complex layer stack, wherein the lateral distance in the width direction may be defined prior to providing mask features, which may define the lateral dimensions in the length direction. To this end, a mask opening may be formed in a mask layer, wherein the lateral dimensions may be reduced, for instance, by forming spacer elements, thereby adjusting the distance in the width direction on the basis of well-controllable deposition and etch techniques. Consequently, superior process uniformity may be accomplished without unduly contributing to process complexity, since only an additional deposition process and an additional etch process may be applied compared to conventional strategies. Furthermore, respective lithography masks for forming the opening for defining the distance that separates the mask features may be generated by taking into account the reduction in lateral size of the mask opening, which may be accomplished on the basis of conventional mask data sets, without requiring complex redesigns.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming gate electrode structures of a semiconductor device, the method comprising:
   reducing lateral dimensions of a mask opening formed in a mask layer that is formed above a gate layer stack;
   forming a first mask feature above said mask layer and above said mask opening, said first mask feature defining a gate length of gate electrode structures to be formed from said gate layer stack, said mask opening with said reduced lateral dimensions defining a pitch of said gate electrode structures in a lateral direction perpendicular to said gate length;
   forming second mask features from said mask layer by using said first mask feature and said mask opening as an etch mask; and
   forming said gate electrode structures by performing an etch process and using said second mask features as a further etch mask.

2. The method of claim 1, wherein said gate length is selected to be approximately 50 nm or less.

3. The method of claim 1, wherein reducing lateral dimensions of said mask opening comprises depositing a spacer layer and forming a spacer element from said spacer layer on inner sidewalls of said mask opening.

4. The method of claim 3, further comprising providing at least one etch control layer prior to forming said spacer layer.

5. The method of claim 4, wherein said etch control layer is formed on said mask layer prior to forming said mask opening.

6. The method of claim 1, wherein forming said first mask feature comprises performing a lithography process so as to define an initial gate length and performing a trim process so as to define said gate length.

7. A method, comprising:
   forming a layer of gate electrode material above a semiconductor substrate;
   forming a mask layer above said layer of gate electrode material;
   performing at least one process operation to form first and second mask features in said mask layer, wherein at least opposing ends of said first and second mask features have sidewall spacers formed thereon that define a spacing there between; and
   after performing said at least one process operation, performing at least one etching process on at least said layer of gate electrode material through said spacing defined by said spacers to thereby define first and second gate electrode structures that have opposing end surfaces.

8. The method of clam 7, wherein a distance between said opposing ends of said first and second gate electrode structures corresponds to said spacing between said sidewall spacers.

9. The method of claim 7, wherein said sidewall spacers are formed only on said opposing ends of said first and second mask features.

* * * * *